United States Patent
Ramkumar

(10) Patent No.: US 6,838,392 B1
(45) Date of Patent: Jan. 4, 2005

(54) METHODS OF FORMING SEMICONDUCTOR STRUCTURES, AND ARTICLES AND DEVICES FORMED THEREBY

(75) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/119,574

(22) Filed: Apr. 9, 2002

Related U.S. Application Data

(63) Continuation of application No. 10/098,259, filed on Mar. 15, 2002, now abandoned.

(51) Int. Cl.[7] .............................................. H01L 21/00
(52) U.S. Cl. ........................ 438/745; 438/756; 438/757
(58) Field of Search ................................ 438/745, 756, 438/757, 424, 426, 749, 906, 700, FOR 227

(56) References Cited

U.S. PATENT DOCUMENTS

| | | | | |
|---|---|---|---|---|
| 5,258,332 A | * | 11/1993 | Horioka et al. ............. | 438/389 |
| 5,578,518 A | * | 11/1996 | Koike et al. ................ | 438/424 |
| 5,880,004 A | * | 3/1999 | Ho .............................. | 438/421 |
| 5,940,716 A | * | 8/1999 | Jin et al. ..................... | 438/424 |
| 5,956,598 A | * | 9/1999 | Huang et al. ............... | 438/424 |
| 5,963,819 A | * | 10/1999 | Lan ............................. | 438/424 |
| 5,976,951 A | * | 11/1999 | Huang et al. ............... | 438/435 |
| 6,005,279 A | * | 12/1999 | Luning ....................... | 257/510 |
| 6,027,982 A | * | 2/2000 | Peidous et al. ............. | 438/434 |
| 6,040,232 A | * | 3/2000 | Gau ............................ | 438/424 |
| 6,261,921 B1 | | 7/2001 | Yen et al. | |
| 6,265,317 B1 | | 7/2001 | Chiu et al. | |
| 6,331,469 B1 | * | 12/2001 | Park et al. .................. | 438/296 |

\* cited by examiner

Primary Examiner—W. David Coleman
(74) Attorney, Agent, or Firm—Evan Law Group LLC

(57) ABSTRACT

A method of forming a semiconductor structure is described that includes etching a trench in a semiconductor substrate, wherein an oxide layer overlies the semiconductor substrate, and a nitride layer overlies the oxide layer; and cleaning the semiconductor substrate while simultaneously performing a pull back of the nitride layer. Methods of making semiconductor devices and electronic devices, and silicon wafers having trenches and isolation regions formed by the above-mentioned methods are also described.

20 Claims, 7 Drawing Sheets

| DILUTION RATIO | ox ER | Nit ER | RATIO |
|---|---|---|---|
| 0.10 | 7.03 | 7.87 | 1.12 |
| 0.08 | 6.33 | 8.60 | 1.36 |
| 0.07 | 3.00 | 8.39 | 2.80 |

METHODS OF FORMING SEMICONDUCTOR STRUCTURES, AND ARTICLES AND DEVICES FORMED THEREBY

This application is a continuation of application Ser. No. 10/098,259, filed Mar. 15, 2002, abandoned, which is hereby incorporated by reference herein.

BACKGROUND

This invention relates to the field of semiconductor technology and, more particularly, to the field of shallow trench isolation.

As the dimensions and feature sizes of semiconductor devices become increasingly smaller, the electrical isolation of individual devices on a chip becomes progressively more challenging. Each device on an integrated circuit chip must be electrically isolated from neighboring devices in order to enable the independent operation of the device and to prevent short-circuiting.

One of the most widely used techniques for the isolation of semiconductor devices is known as shallow trench isolation (STI). The typical steps involved in the fabrication of an STI structure in a semiconductor substrate are illustrated in FIGS. 1–4. The semiconductor substrate 2 shown in FIG. 1 is made by forming a pad (or buffer) oxide layer 4 over a silicon layer 6. A nitride layer 8 is then deposited over the pad oxide layer 4. A photoresist layer 10 is then deposited over nitride layer 8 and patterned using photolithography to create a soft mask opening 12. The nitride layer 8 and oxide layer 4 are successively etched through soft mask opening 12 to create an opening 14, as shown in FIG. 2. Silicon layer 6 is then etched through opening 14 to form a shallow trench 16. In general, etching of the nitride layer 8, pad oxide layer 4, and silicon layer 6 is desirably achieved by anisotropic etching, such that the sidewalls of the trench formed are vertical. Photoresist 10 is removed and the trench 16 is oxidized to produce a liner oxide 15. Trench 16 is then filled with a dielectric material 17 (e.g., an oxide) to provide the structure shown in FIG. 3. Chemical mechanical polishing (CMP) of this structure and removal of nitride layer 8 and pad oxide layer 4 completes the process, and provides the shallow trench isolation structure 18 shown in FIG. 4.

While STI technology has proven to be a highly effective isolation technique-one that avoids the undesirable Bird's Beak formation encountered in other isolation methodologies, such as localized oxidation of silicon (LOCOS)—the performance characteristics of devices created by STI etching can be adversely affected by the presence of sharp top corners 20 on the trench 16. Sharp top corners 20 may result in junction leakage currents, lowered threshold voltages, and unwanted increases in sub-threshold currents when the field effect transistors (FETs) are activated.

A significant problem resulting from the exposure of the top corners of shallow trench isolation structures to wet clean chemistries is shown in FIG. 5. The filling oxide layer 17 in the vicinity of the sharp top corners 20 recedes to form a dip 21, which contributes to the leakage current of MOSFETs and a reduction in threshold voltages.

The effect of STI trench corner sharpness on the threshold voltage of narrow transistors is known as the "Inverse Narrow Width Effect" (INWE). Several strategies have been developed for counteracting or reducing the INWE, including adding a masked boron or $BF_2$ implant into the core of the memory to raise the threshold voltage of the narrow transistors in the core. However, such a doping method is undesirable in that it adds at least two steps to the processing without substantially compensating for the INWE. Alternatively, techniques for increasing STI corner rounding have been developed, including high temperature (i.e., ca. 1100° C.) liner oxidation, liner oxidation in a chlorine ambient, HF undercut of the pad oxide prior to liner oxidation, and high temperature (i.e., ca. 1100° C.) oxidation after CMP. However, each of these techniques suffers from at least one drawback. For example, corner rounding by modification of the etch typically necessitates the use of a new tool, whereas modifications of the oxidation involving very high temperatures may result in increased stress under the nitride layer which in turn may cause dislocations in the active silicon area beneath it.

U.S. Pat. No. 6,265,317 to Chiu et al. describes a process for top corner rounding in an STI structure that involves the selective etching of the nitride layer with a hot phosphoric acid wet etch chemistry. This process results in pull back of the nitride layer from the trench rim. However, in addition to adding a step to the processing, this method is undesirable in that it employs phosphoric acid, which can result in phosphorous contamination of the trench walls at a sensitive stage in the processing.

The present invention is directed to providing shallow trench isolation structures having desirable structural profiles (e.g., rounded top corners) in a simplified and improved manner.

SUMMARY

The scope of the present invention is defined solely by the appended claims, and is not affected to any degree by the statements within this summary.

In a first aspect, the present invention is a method of forming a semiconductor structure that includes (a) etching a trench in a semiconductor substrate, wherein an oxide layer overlies the semiconductor substrate, and a nitride layer overlies the oxide layer; and (b) cleaning the semiconductor substrate while simultaneously performing a pull back of the nitride layer.

In a second aspect, the present invention is a method of making a semiconductor device that includes making a semiconductor structure by the method described above, and forming a semiconductor device from the structure.

In a third aspect, the present invention is a method of making an electronic device that includes making a semiconductor device by the method described above, and forming an electronic device that includes the semiconductor device.

In a fourth aspect, the present invention is a method of forming a trench having reduced defects that includes (a) etching a trench in a semiconductor substrate, wherein an oxide layer overlies the semiconductor substrate, and a nitride layer overlies the oxide layer; and (b) isotropically etching the semiconductor substrate with a wet etch chemistry comprising a dilute aqueous solution of hydrofluoric acid at a temperature of at least 90 degrees Celsius, whereby the nitride layer and the oxide layer are pulled back from the trench rim, and wherein the nitride layer is pulled back at least twice as fast as the oxide layer.

DETAILED DESCRIPTION

It has been discovered that a semiconductor structure lacking the undesirable sharp top corners which give rise to the INWE can be prepared by performing a pull back of the nitride layer while simultaneously performing a post-trench etch clean of the substrate. The simultaneous nitride layer pull back and clean is performed using a hot wet etch chemistry, such as a dilute aqueous solution of hydrofluoric acid or a buffered oxide solution of ammonium fluoride.

Typically, a solution of hydrofluoric acid at room temperature has been used to clean and remove polymeric debris from semiconductor substrates following trench etching. Conventional wisdom in the art has long held that hydrofluoric acid—while suitable for cleaning purposes—is unsuitable for etching of the nitride layer because the rate of such an etching will be inordinately slow. Accordingly, in spite of the problems associated with phosphorous contamination of the walls of the trench, phosphoric acid has nonetheless been employed as the wet chemistry etchant of choice for the etching of nitride layers.

Figure 1:
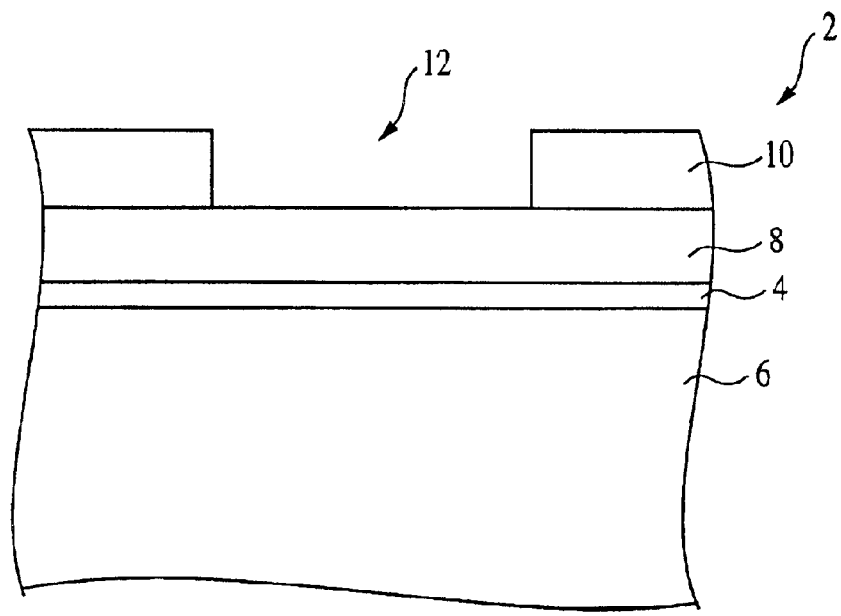
FIG. 1 shows a cross-sectional view of a semiconductor substrate.
Figure 2:
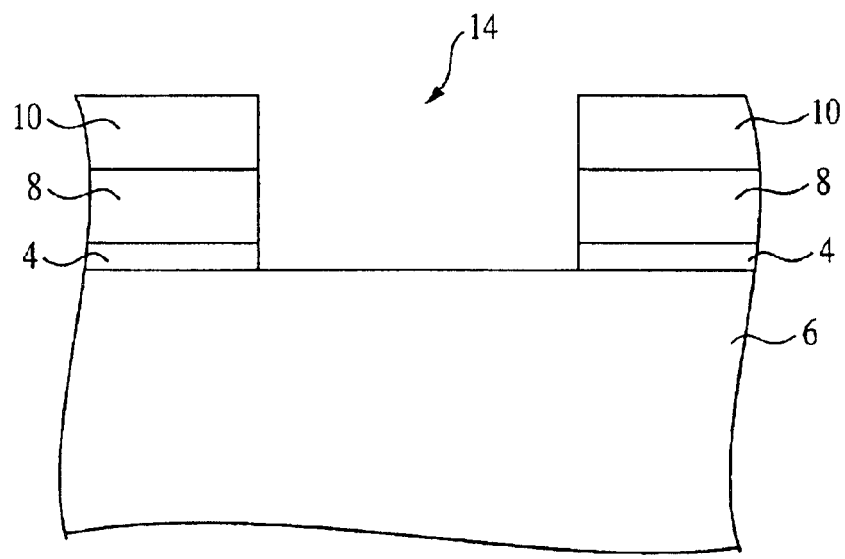
FIG. 2 shows a cross-sectional view of the semiconductor substrate of FIG. 1 after etching.
Figure 3:
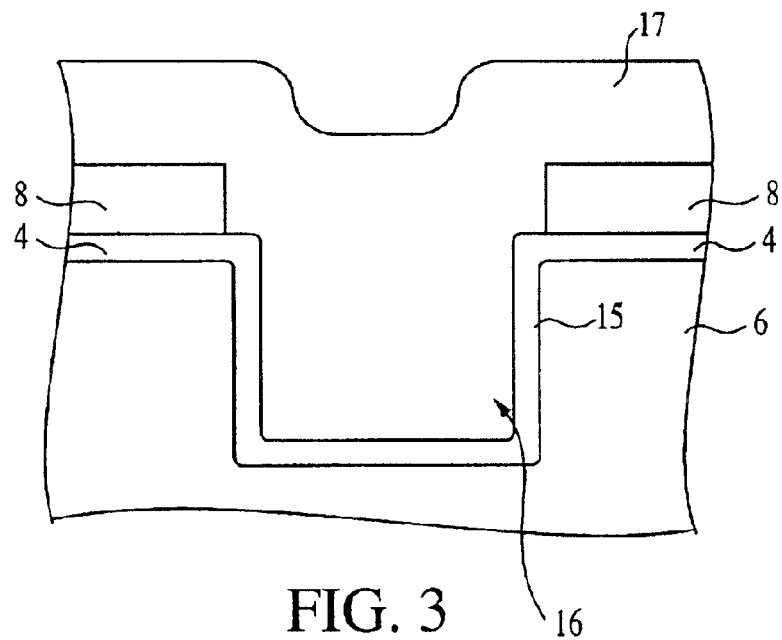
FIG. 3 shows a cross-sectional view of the semiconductor substrate of FIG. 2 after trench formation and filling.
Figure 4:
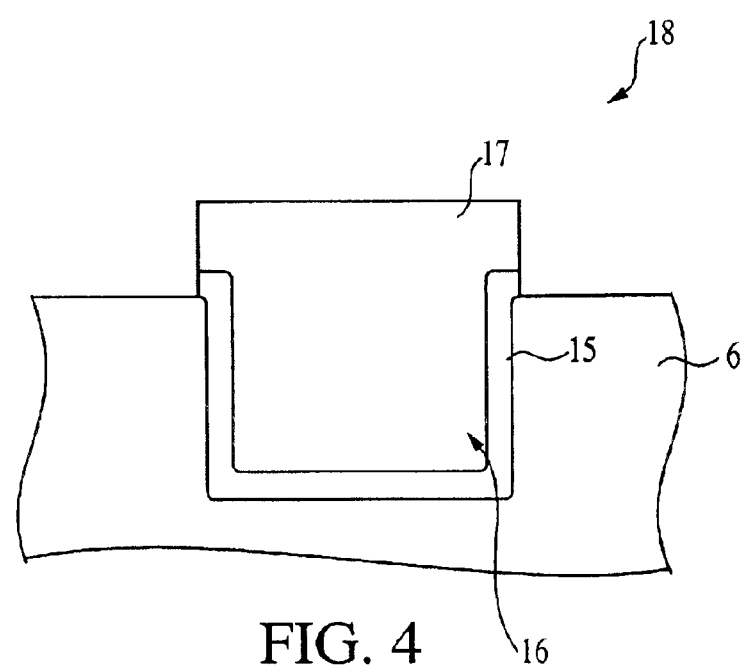
FIG. 4 shows a cross-sectional view of the semiconductor substrate of FIG. 3 after polishing and exposure of the silicon.
Figure 5:
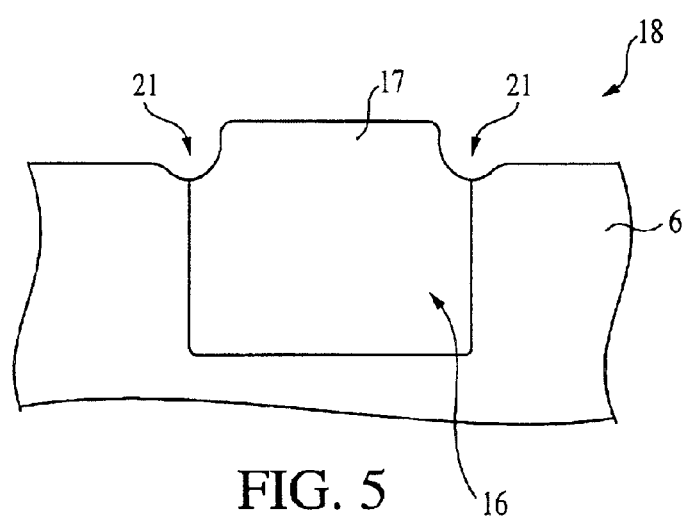
FIG. 5 shows a cross-sectional view of the semiconductor substrate of FIG. 4 after exposure to a wet clean chemistry.
Figure 6:
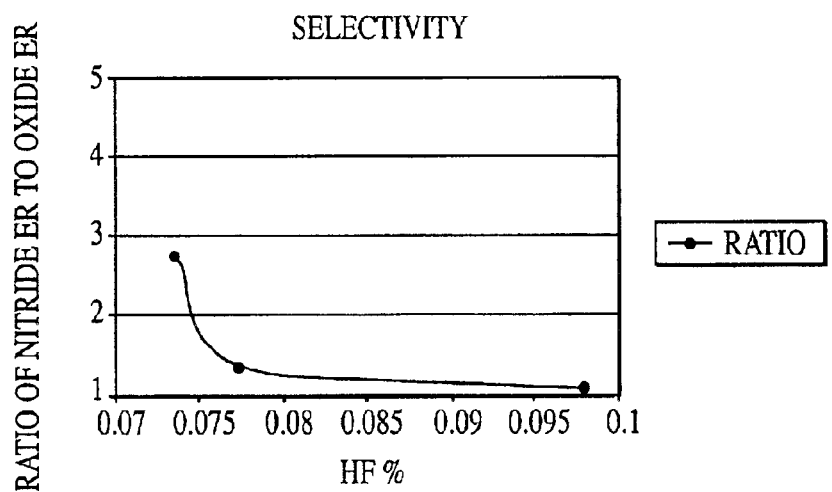
FIG. 6 shows a plot of the nitride to oxide etch ratio versus hydrofluoric acid solution dilution ratio.

Notwithstanding, it has now been discovered, surprisingly and unexpectedly, that a dilute hydrofluoric acid solution can be used to simultaneously clean the semiconductor substrate following trench etching, and to selectively etch the nitride layer. By increasing the temperature of a hydrofluoric acid cleaning solution to a temperature between at least 60° C. and the boiling point, more preferably between at least 75° C. and the boiling point, and still more preferably at least 90° C. and the boiling point, the hydrofluoric acid solution will be suitable for selectively etching the nitride layer. Preferably, the rate at which the nitride layer is etched is at least one-and-one half times as fast as the rate at which the underlying oxide layer is etched, and more preferably at least twice as fast. For example, if a pad oxide layer having a thickness of 100 Angstroms (Å) is etched through completely, then approximately 200 Å of nitride layer will also have been etched. FIG. 6 shows a plot of the nitride to oxide etch ratio versus the concentration of hydrofluoric acid solution. As shown by the plot, a hydrofluoric acid dilution ratio (i.e., volume/volume) of 0.10 corresponds to a nitride to oxide etch ratio of 1.12, a hydrofluoric acid dilution ratio of 0.08 corresponds to a nitride to oxide etch ratio of 1.36, and a hydrofluoric acid dilution ratio of 0.07 corresponds to a nitride to oxide etch ratio of 2.80.

Without wishing to be bound to a particular theory or to in any way diminish the scope of the appended claims and their equivalents, it is presently believed that the mechanism of action by which the dilute hydrofluoric acid cleaning solution etches the nitride layer is due primarily to the action of the hot water. An increased rate of etching of the nitride layer is brought about by the increase in temperature of the water. Surprisingly and unexpectedly, it has been discovered that a nitride wafer will be etched even if treated with steam alone (e.g., in a pressure cooker), regardless of whether hydrofluoric acid or the more conventional phosphoric acid is also present. It is presently believed that role of the hydrofluoric acid (and indeed that of the more conventional phosphoric acid) in etching the nitride layer is primarily to enable the attainment of an increased temperature of the water as compared to the temperature that can be achieved using water itself.

Methods embodying features of the present invention preferably employ a wet etch chemistry comprising a fluorine-containing compound. If the fluorine-containing compound contains fluoride anion, it is preferred that the counterion associated with the fluoride anion is one that does not lead to contamination of the semiconductor substrate. A preferred wet etch chemistry for use in accordance with the present invention is a dilute aqueous solution of hydrofluoric acid (e.g., 0.1% volume/volume) employed at a high temperature of at least 90° C., for example, at a temperature of 100° C. Inasmuch as a dilute aqueous solution of hydrofluoric acid employed at room temperature is a preferred material for cleaning semiconductor substrates following trench etching, the use of such solutions at elevated temperatures to accomplish both substrate cleaning and the above-mentioned nitride etching is especially convenient. An alternative wet etch chemistry for use in accordance with the present invention is an aqueous solution of a fluorine-containing compound, for example, ammonium fluoride, employed at a temperature of at least 60° C.

The above-mentioned selective etching of the nitride layer results in a pull back of the nitride layer from the rim of the trench and, to a lesser extent, in the pull back of the oxide layer from the rim of the trench. The etching of the nitride layer occurs isotropically (i.e., to the same extent in all directions), such that the nitride layer is reduced both laterally as well as from the top. By way of illustration, if a nitride layer is etched laterally by 250 Å, then it will also be etched by about 250 Å in the vertical direction as well. Furthermore, once the pull back of the nitride layer has begun, the underlying oxide layer will also be etched both laterally as well as from the top. Thus, the nitride layer is pulled back while the pad oxide layer is etched at the corner. As a result, the silicon substrate is exposed to liner oxidation which results in improved corner rounding, and the corners of the active area are not exposed to subsequent wet etches, thereby preventing corner recession from occurring. After the trench has been filled with dielectric material (e.g., oxide), the filling material will completely cover the STI corners thereby preventing the INWE.

In short, methods embodying features of the present invention enable the preparation of trenches having rounded top corners by preventing exposure of the corners in the first place, without requiring additional processing steps, materials, or equipment, and without introducing undesirable phosphorous contamination into the substrate.

Figure 7:
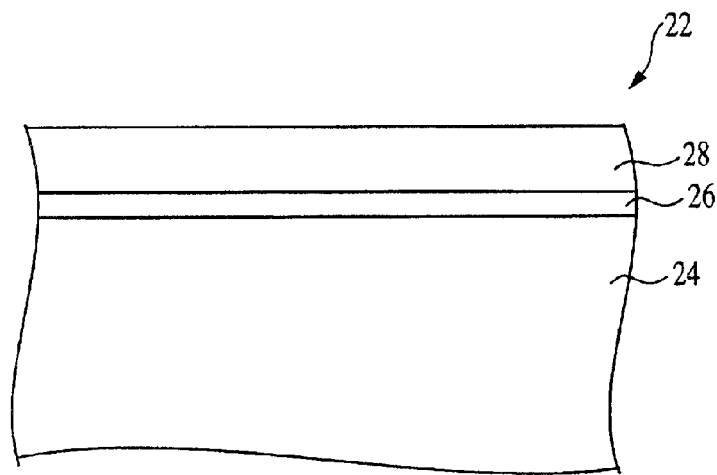
FIG. 7 shows a cross-sectional view of a semiconductor substrate for use in accordance with the present invention.

A semiconductor substrate 22 for use in accordance with the present invention is shown in FIG. 7. A semiconductor layer 24 in which the shallow trench structure is to be etched is provided. The semiconductor layer 24 is preferably silicon. Silicon layer 24 can be doped or undoped, and is preferably single crystal silicon having substantially <100> orientation.

A pad insulating layer 26, preferably a pad oxide layer (e.g., silicon oxide), is formed, typically by thermal oxidation, on the surface of silicon layer 24, and provides a stress-release layer for the structure. The thickness of pad oxide layer 26 is preferably between 20 and 500 Å. More preferably, the thickness is between 35 and 350 Å. Still more preferably, the thickness is between 50 and 200 Å. An especially preferred thickness of pad oxide layer 26 is 100 Å.

Barrier layer 28, preferably a nitride layer (e.g., silicon nitride or silicon oxynitride), is then deposited over pad oxide layer 26, typically by a chemical vapor deposition (CVD) process, and serves as an oxidation barrier layer and hard mask in the subsequent processing steps. The thickness of nitride layer 28 is preferably between 250 and 5000 Å. More preferably, the thickness is between 500 and 3000 Å. Still more preferably, the thickness is between 1000 and 2000Å.

Figure 8:
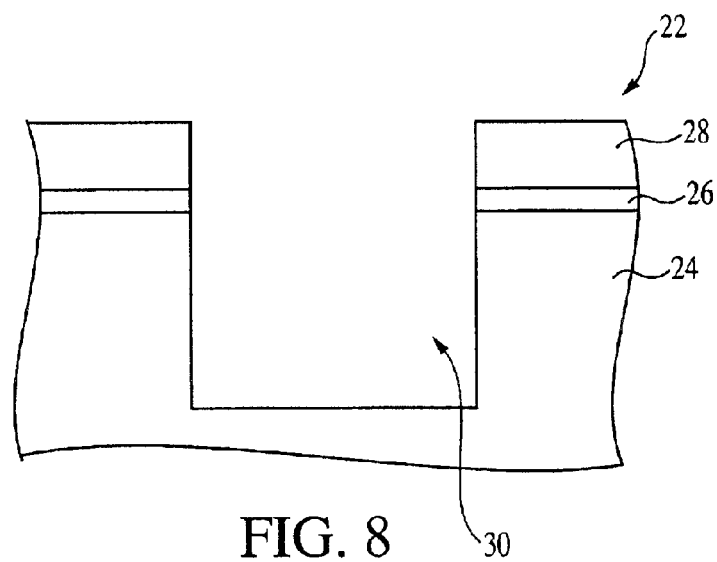
FIG. 8 shows a cross-sectional view of the semiconductor substrate of FIG. 7 after shallow trench etching.
Figure 9:
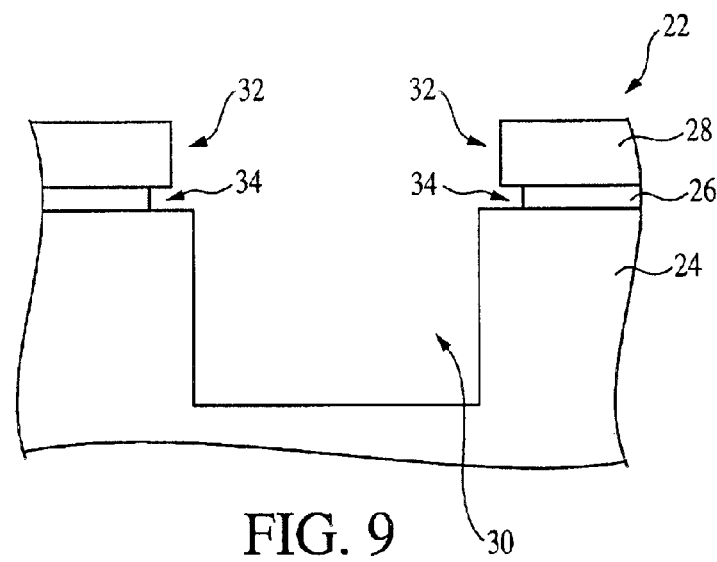
FIG. 9 shows a cross-sectional view of the semiconductor substrate of FIG. 8 after pull back of the nitride and oxide layers.

A method of forming an STI embodying features of the present invention includes etching a trench 30 in the semiconductor substrate 22, as shown in FIG. 8, and cleaning the semiconductor substrate 22 while simultaneously performing a pull back of the nitride layer 28. As described above, a wet etching chemistry is employed for the simultaneous cleaning and pull back of the nitride layer, and results in a pull back of the oxide layer as well. The pull back 32 of the nitride layer 28 and the pull back 34 of the oxide layer 26 is illustrated in FIG. 9. The pull back 32 of the nitride layer 28 is preferably at least one-and-one-half times as fast as the pull back 34 of the oxide layer 26, which is typically substantially thinner than the nitride layer 28. Preferably, the pull back 32 of the nitride layer 28 is at least 100 Å from the trench rim, more preferably at least 150 Å.

In accordance with the present invention, when pad insulating layer 26 and barrier layer 28 are not oxide and nitride, respectively, the requirement is that each layer be differentially etched by the wet etch chemistry.

Figure 10:
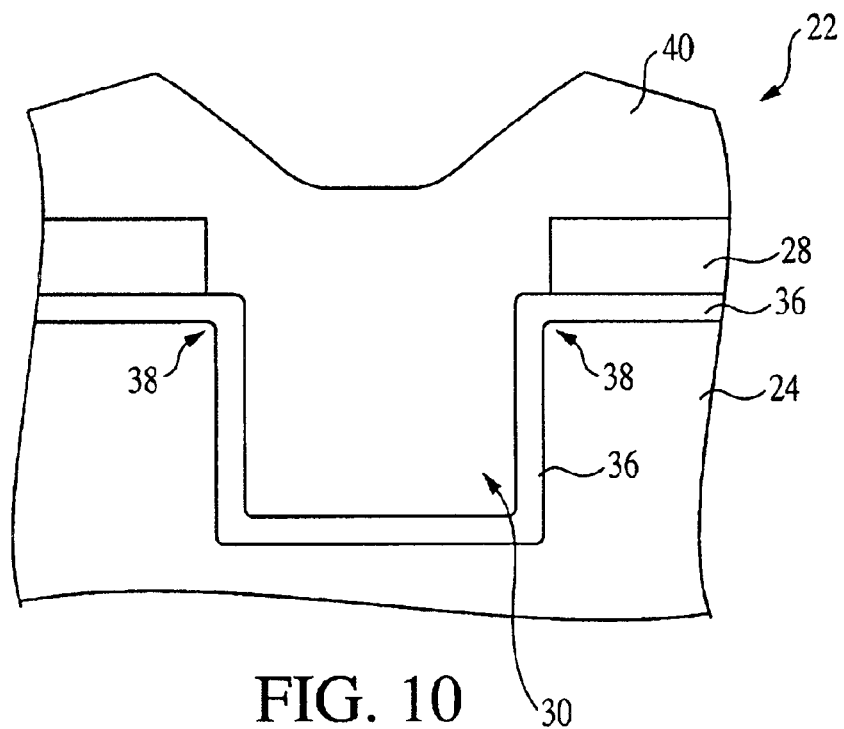
FIG. 10 shows a cross-sectional view of the semiconductor substrate of FIG. 9 after liner oxidation and gap fill.
Figure 11:
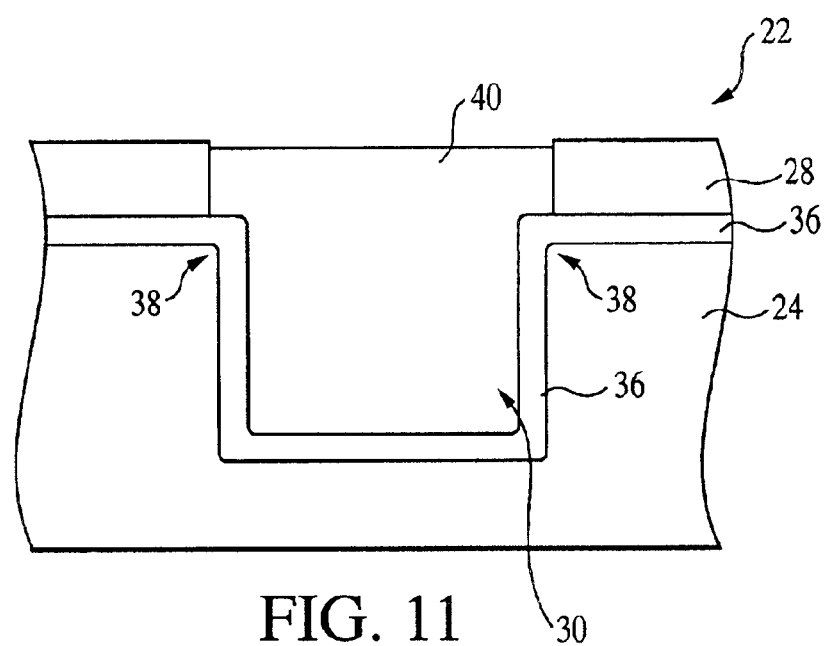
FIG. 11 shows a cross-sectional view of the semiconductor substrate of FIG. 10 after chemical mechanical polishing.
Figure 12:
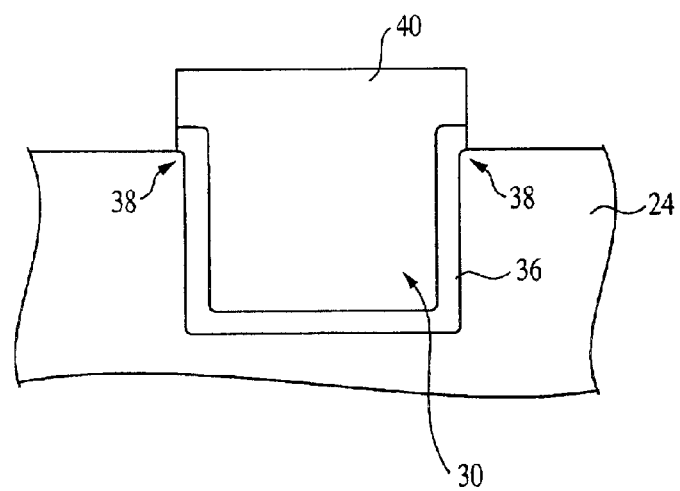
FIG. 12 shows a cross-sectional view of the semiconductor substrate of FIG. 11 after stripping of the nitride layer.

Methods embodying features of the present invention preferably further comprises performing a liner oxidation of the trench to form a liner 36, shown in FIG. 10, which prevents corners 38 from being exposed, thereby avoiding the INWE. Trench 30 can then be filled with a dielectric material (e.g., an oxide) 40, as shown in FIG. 10. Chemical mechanical polishing of the semiconductor substrate 22 to remove excess dielectric material 40 provides the semiconductor structure shown in FIG. 11. Removal of nitride layer 28 and removal of the subsequently exposed portions of layer 36 completes the processing and provides the semiconductor structure shown in FIG. 12.

An STI structure produced in accordance with and embodying features of the present invention may undergo additional processing in order to produce semiconductor devices and electronic devices incorporating such semiconductor devices. As described above, the trench once formed may be filled with a dielectric material (e.g., an oxide), and then subjected to a CMP process to produce a polished isolation region. The isolation region, once formed, may be used to construct a semiconductor device. For example, source/drain regions, gates, gate dielectric layers, and the like may be formed on the semiconductor substrate to make transistors, which may be connected together through dielectric layers by contacts and metallization layers. Such additional elements may be formed before, during, or after formation of the isolation regions.

STI structures embodying features of and produced in accordance with the present invention may be incorporated into a great variety of semiconductor devices, including but not limited to: integrated circuits (e.g., memory cells such as SRAM, DRAM, EPROM, EEPROM, and the like); programmable logic devices; data communications devices; clock generation devices; and so forth. Furthermore, any of these semiconductor devices may itself be incorporated into a multitude of electronic devices, including but not fin limited to computers, automobiles, airplanes, satellites, and the like.

Numerous additional variations in the presently preferred embodiments illustrated herein will be determined by one of ordinary skill in the art, and remain within the scope of the appended claims and their equivalents. For example, while the examples provided hereinbelow relate to silicon-based semiconductor substrates, it is contemplated that alternative semiconductor materials can likewise be employed in accordance with the present invention, and that the semiconductor substrates may be undoped, P-doped, or N-doped. Suitable semiconductor materials include but are not limited to silicon, gallium arsenide, germanium, gallium nitride, aluminum phosphide, $Si_{1-x}Ge_x$ and $Al_xGa_{1-x}As$ alloys, wherein x is greater than or equal to zero and less than or equal to one, the like, and combinations thereof. Additional examples of semiconductor materials for use in accordance with the present invention are set forth in *Semiconductor Device Fundamentals* by Robert F. Pierret (p. 4, Table 1.1, Addison-Wesley, 1996).

The individual semiconductor processing steps used in accordance with the present invention (e.g., etching, CVD, etc.) are well known to those of ordinary skill in the art, and are also described in numerous publications and treatises, including: *Encyclopedia of Chemical Technology*, Volume 14 (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant ($4^{th}$ Edition, McGraw-Hill, 2000).

Obviously, numerous modifications and variations of the present invention are possible in light of the above teachings. It is therefore to be understood that within the scope of the appended claims, the invention may be practiced otherwise than as specifically described herein.

What is claimed is:

1. A method of forming a semiconductor structure comprising:

cleaning a semiconductor substrate while simultaneously etching a nitride layer, wherein a trench is present in the semiconductor substrate, an oxide layer is on the semiconductor substrate, and the nitride layer is on the oxide layer; and etching the oxide layer;

wherein the etching of the nitride layer is at least one-and-one-half times as fast as the etching of the oxide layer, a wet etch chemistry is used for the cleaning, the etching of the nitride layer, and the etching of the oxide layer, and the wet etch chemistry comprises an aqueous solution of hydrofluoric acid at a temperature of at least 60 degrees Celsius.

2. The method of claim 1 wherein the temperature is at least 75 degrees Celsius.

3. The method of claim 1 further comprising performing a liner oxidation of the trench.

4. The method of claim 3 further comprising filling the trench with a dielectric material.

5. The method of claim 4 further comprising performing a chemical mechanical polishing of the semiconductor substrate.

6. A method of making a semiconductor device comprising:
   making a semiconductor structure by the method of claim 1; and
   forming a semiconductor device from the structure.

7. A method of making an electronic device comprising:
   making a semiconductor device by the method of claim 6; and
   forming an electronic device, which comprises the semiconductor device.

8. A method of forming a semiconductor structure comprising:
   cleaning a semiconductor substrate while simultaneously etching a nitride layer, wherein a trench is present in the semiconductor substrate, an oxide layer is on the semiconductor substrate, and the nitride layer is on the oxide layer; and
   etching the oxide layer;
   wherein the etching of the nitride layer is at least one-and-one-half times as fast as the etching of the oxide layer,
   a wet etch chemistry is used for the cleaning, the etching of the nitride layer, and the etching of the oxide layer, and
   the wet etch chemistry comprises an aqueous solution of ammonium fluoride at a temperature of at least 60 degrees Celsius.

9. The method of claim 8 wherein the temperature is at least 75 degrees Celsius.

10. A method of making a semiconductor device comprising:
    making a semiconductor structure by the method of claim 8; and
    forming a semiconductor device from the structure.

11. A method of making an electronic device comprising:
    making a semiconductor device by the method of claim 10; and
    forming an electronic device, which comprises the semiconductor device.

12. A method of forming a semiconductor structure comprising:
    forming an oxide layer on a semiconductor substrate;
    forming a nitride layer on the oxide layer;
    etching a trench in the semiconductor substrate; and
    etching the nitride layer and the oxide layer from the trench rim with a dilute aqueous solution of hydrofluoric acid at a temperature of at least 90 degrees Celsius, wherein the nitride layer is pulled back at a rate at least twice as fast as the oxide layer.

13. A method of making a semiconductor device comprising:
    making a semiconductor structure by the method of claim 12; and
    forming a semiconductor device from the structure.

14. A method of making an electronic device comprising:
    making a semiconductor device by the method of claim 13; and
    forming an electronic device, which comprises the semiconductor device.

15. A method of forming a trench having rounded top corners comprising:
    etching a trench in a semiconductor substrate, wherein an oxide layer overlies the semiconductor substrate, and a nitride layer overlies the oxide layer; and
    isotropically etching the semiconductor substrate with a wet etch chemistry comprising a dilute aqueous solution of hydrofluoric acid at a temperature of at least 90 degrees Celsius, whereby the nitride layer and the oxide layer are pulled back from the trench rim, and wherein the nitride layer is pulled back at least twice as fast as the oxide layer.

16. A method of making a semiconductor device comprising:
    forming a trench having rounded top corners by the method of claim 15; and
    forming a semiconductor device from the trench having rounded top corners.

17. A method of making an electronic device comprising:
    making a semiconductor device by the method of claim 16; and
    forming an electronic device, which comprises the semiconductor device.

18. In a method of forming a shallow trench isolation structure comprising forming an oxide layer on a semiconductor substrate, forming a nitride layer on the oxide layer, and etching a trench in the semiconductor substrate, the improvement comprising:
    simultaneously etching the nitride layer while cleaning the semiconductor substrate; and
    etching the oxide layer;
    wherein the etching of the nitride layer is at least one-and-one-half times as fast as the etching of the oxide layer,
    a wet etch chemistry is used for the cleaning, the etching of the nitride layer, and the etching of the oxide layer, and
    the wet etch chemistry comprises an aqueous solution of hydrofluoric acid at a temperature of at least 60 degrees Celsius.

19. The improvement of claim 18 wherein the temperature is at least 75 degrees Celsius.

20. In a method of forming a shallow trench isolation structure comprising forming an oxide layer on a semiconductor substrate, forming a nitride layer on the oxide layer, and etching a trench in the semiconductor substrate, the improvement comprising:
    simultaneously etching the nitride layer while cleaning the semiconductor substrate; and
    etching the oxide layer,
    wherein the etching of the nitride layer is at least one-and-one-half times as fast as the etching of the oxide layer,
    a wet etch chemistry is used for the cleaning, the etching of the nitride layer, and the etching of the oxide layer, and
    the wet etch chemistry comprises an aqueous solution of ammonium fluoride at a temperature of at least 60 degrees Celsius.

* * * * *